United States Patent [19]

Weng

[11] Patent Number: 5,379,305
[45] Date of Patent: Jan. 3, 1995

[54] ERROR CORRECTION SYSTEM WITH SELECTABLE ERROR CORRECTION CAPABILITIES

[75] Inventor: Lih-Jyh Weng, Shrewsbury, Mass.

[73] Assignee: Digital Equipment Corporation, Maynard, Mass.

[21] Appl. No.: 918,208

[22] Filed: Jul. 20, 1992

[51] Int. Cl.⁶ ................................. H03M 13/00
[52] U.S. Cl. .................. 371/41; 371/37.1; 371/38.1; 371/39.1
[58] Field of Search ............ 371/41, 37.1, 39.1, 371/40.1, 45, 38.1, 40.3

[56] References Cited

U.S. PATENT DOCUMENTS

| | | |
|---|---|---|
| 4,047,151 | 9/1977 | Rydbeck et al. |
| 4,462,101 | 7/1984 | Yasuda et al. ............ 371/43 |
| 4,506,252 | 3/1985 | Jacoby et al. |
| 4,608,692 | 8/1986 | Nagumo et al. ............ 371/37.1 |
| 4,654,853 | 3/1987 | Moriyama et al. ............ 371/41 |
| 4,675,869 | 6/1987 | Driessen ............ 371/37 |
| 4,701,923 | 10/1987 | Fukasawa et al. ............ 371/41 |
| 4,835,629 | 5/1989 | Uemo et al. |
| 4,908,621 | 3/1990 | Polomio et al. ............ 341/120 |
| 4,918,446 | 4/1990 | Yagi |
| 4,922,494 | 5/1990 | Pirami et al. ............ 371/35 |
| 5,224,106 | 6/1993 | Weng ............ 371/37.1 |
| 5,267,248 | 11/1993 | Reyner ............ 371/25.1 |

OTHER PUBLICATIONS

Bhargawa et al. "Error Control for Mobile Radio System" IEEE 1989 pp. 535–537.
Soliman "Performance of Coded Systems Over Fading II is Persive Channels" IEEE 1992 pp. 51–59.
Hussain et al. "Decoding a class of non binary codes using neural networks" IEEE 1991 pp. 41–43.

*Primary Examiner*—Robert W. Beausoliel, Jr.
*Assistant Examiner*—Albert Decady
*Attorney, Agent, or Firm*—Albert P. Cefalo; Ronald C. Hudgens; James F. Thompson

[57] ABSTRACT

A single Reed-Solomon code is employed with modifications to allow information systems the freedom of selecting redundancy from 1 to R symbols, where R is the number of redundant symbols that the unmodified Reed-Solomon code employs. If P is the number of discarded redundancy symbols, then R−P redundancy symbols are retained, and the minimum distance of the modified code is 1+R−P. The system uses one of several alternative decoding schemes. One general scheme employs error-and-erasure decoding, and treats the P deleted symbols as erasures. Another general scheme operates directly on the shortened, modified code-word and modifies both the error syndromes and the error information derived from the syndromes to compensate for the deleted symbols.

15 Claims, 7 Drawing Sheets

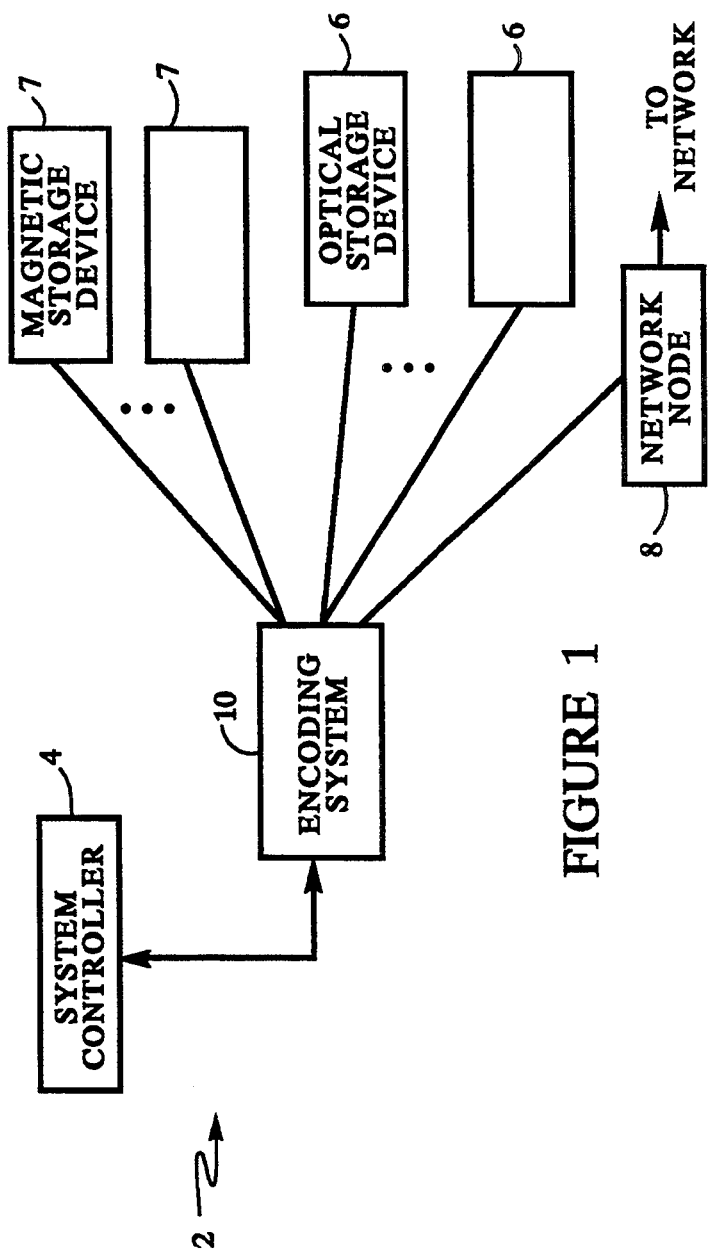
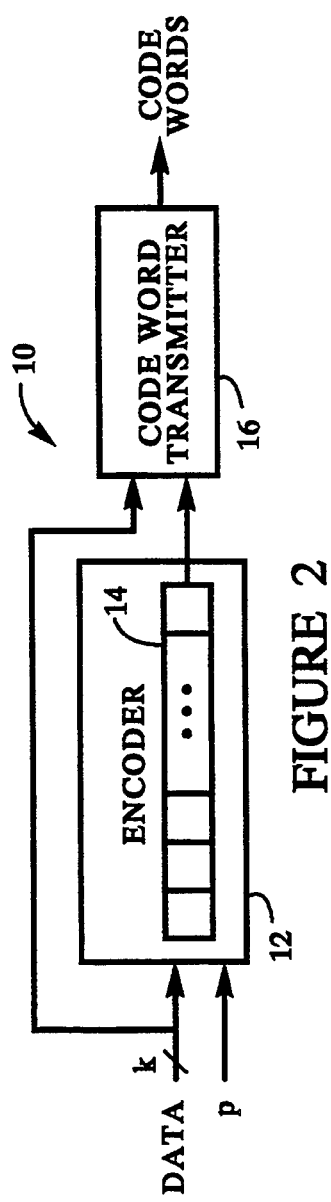
FIGURE 1
FIGURE 2

ERROR CORRECTION SYSTEM WITH SELECTABLE ERROR CORRECTION CAPABILITIES

FIELD OF THE INVENTION

The invention relates generally to error correction of data and more particularly to error correction encoding with selectable error correction capabilities.

BACKGROUND

The importance of error correction coding of data in digital computer systems has increased greatly as the density of the data recorded on mass storage media, more particularly magnetic disks, has increased. With higher recording densities, a tiny imperfection in the recording surface of a disk can corrupt a large amount of data. In order to avoid losing that data, error correction codes ("ECC's") are employed to, as the name implies, correct the erroneous data.

Before a string of data symbols is recorded on a disk, it is mathematically encoded to form ECC, or redundancy, symbols. The redundancy symbols are then appended to the data string to form code words—data symbols plus redundancy symbols—and the code words are then stored on the disk. When the stored data is to be accessed, the code words containing the data symbols are retrieved from the disk and mathematically decoded. During decoding any errors in the data are detected and, if possible, corrected through manipulation of the redundancy symbols [For a detailed description of decoding see Peterson and Weldon, *Error Correcting Codes*, 2d Edition, MIT Press, 1972].

Stored digital code words can contain multiple errors. One of the most effective types of ECC used for the correction of multiple errors is a Reed-Solomon code see Peterson and Weldon, *Error Correcting Codes*]. Error detection and correction techniques for Reed-Solomon ECC's are well known. Id.

An (n,k) Reed-Solomon ECC encodes k data symbols to form n-k, or r, redundancy symbols. The (n,k) code has a minimum distance of $D = r+1$, which means that each code word differs from every other code word by at least $r+1$ symbols. The number of errors which an ECC can correct is directly related to the number of redundancy symbols it produces. Each redundancy symbol can be used to determine, that is, solve for, either an error location or an error value. Thus, two redundancy symbols are required to correct each error. The (n,k) code can correct up to $(D-1)/2$ errors in an n-symbol code word.

An erasure is an error with a known location. Such errors may, for example, be detected during detection and demodulation of signals retrieved from a magnetic disk drive. The system retains a pointer to the location of the erasure. Accordingly, only one redundancy symbol is required to correct an erasure since only the data value of the erasure is unknown. The (n,k) code can thus correct e erasures, $0 \leq e \leq D-1$, and $[(D-1)-e]/2$ errors.

A system designer may not be able to find a Reed-Solomon ECC which can correct a desired number of errors in the k data symbols, that is, a code which generates R redundancy symbols by encoding k data symbols. The designer may, for example, find a code which generates $R+t$ redundancy symbols by encoding the k data symbols and formulates code words with $k+R+t$ symbols. Such a code is not acceptable, however, for a system which has allocated to a code word a $(k+R)$-symbol storage space. Accordingly, the designer may select an ECC with a longer length, for example, an (N,K) code, where $N > n$ and $K > k$, which produces $N-K$, or R, redundancy symbols and then truncate the code word by eliminating some of the data symbols. This process is often termed "shortening" of the code, however, we shall use the term truncate to avoid confusion with the system described herein.

Truncating an (N,K) code consists of selecting as valid code words only those code words of the original (N,K) ECC which include "i" leading symbols which correspond with a predetermined pattern, for example, i leading all-zero symbols, where $K-i=k$. In a binary code, for example, there are $2^{K-i}$ of these code words. The selected code words form an $(N-i, K-i)$ sub-code of the (N,K) code. If the i leading symbols are deleted, code words with k data symbols and R redundancy symbols are produced. Since these code words include the same number of redundancy symbols as code words of the original (N,K) code, the same number of errors can be corrected. Truncated codes are discussed in detail in Peterson and Weldon, *Error Correcting Codes*.

To correct errors in the truncated code words, the system could replace the truncated symbols and employ conventional error correction techniques designed for the (N,K) code. The system thus manipulates the R redundancy symbols to generate error syndromes and determines from these the error locations and error values. Alternatively, since the deleted leading-zero symbols do not affect the manipulations of the redundancy symbols which produce the error correction syndromes, the system can generate the error syndrome without replacing the truncated symbols. However, when the system determines error location using these syndromes, the system must take into account the truncated maximum code word length, which is $N-i$ symbols. Using either approach, the system manipulates the R redundancy symbols to correct up to $R/2$ code word errors in the $N-i$ code word symbols.

If a known data processing system requires, for certain applications, the capability to correct a large number of errors in the data, the system must use a powerful ECC which produces a large number of redundancy symbols for a given number of data symbols. If the system can sometimes, or for certain applications, operate with a reduced error correction capability it can use a less powerful ECC which produces fewer redundancy symbols for the same amount of data. The system can thus allocate a larger or smaller amount of storage space to a given code word, depending on the error correction requirements.

When a system is storing data on a relatively new disk, for example, the system may use fewer redundancy symbols, that is, a less powerful ECC, to protect the data then it uses to protect data stored on an older, potentially deteriorating disk. Similarly, the system may, in essence, rate the disks according to their overall integrity, or associated error rates, and use more or less powerful ECCs to protect the data stored on the disks, depending on their rankings.

The system may use a more or less powerful code depending on the type of storage medium used, also. A system which has a capability of storing data on both optical and magnetic disks, for example, may use a more powerful code for data which it is storing on the optical disks. The quality of the optical disks is generally not as good as the quality of magnetic disks, and thus, the probability of having a defect in the optical disk is higher, also, and the probability of that defect effecting a relatively large number of data symbols is also higher than the probabilities associated with magnetic disks. Accordingly, the system protects the data with an ECC which can correct a greater number of errors.

In networked data processing systems, data which is to be sent a long distance may be protected with more redundancy symbols then data which is to be sent a shorter distance. The system thus protects the data from transmission errors which are more likely to occur when data is transmitted over the longer communications paths.

To produce both code words with large numbers of redundancy symbols and code words with fewer redundancy symbols, known data processing systems encode the data symbols using different, i.e., more and less powerful, ECCs. Such systems must include different encoders and decoders, for use with the respective ECCs. What is desired is a mechanism by which a system can use a single encoder and decoder to encode and decode these code words.

This is a different problem than the problem solved by truncating, an ECC, since it is the number of code word redundancy symbols which changes not the number of code word data symbols. Accordingly, while the techniques used to generate error syndromes for an (N,K) code can be used with a truncated (N−i, K−i) code, that is, with a code which produces the same number of redundancy symbols, these techniques are not adequate for codes which produce different numbers of redundancy symbols.

SUMMARY

An error correction system, which uses a single encoder with selectable levels of redundancy to encode and decode data, produces for the same number of data symbols code words with selectable numbers of redundancy symbols. The encoder encodes k data symbols in accordance with an (n,k) Reed-Solomon ECC to generate r redundancy symbols. The system selects a desired level of error correction from 1 error to r/2 errors per code word based on, for example, the medium on which the data is to be stored. The system then arbitrarily deletes p of the generated redundancy symbols to produce an (n−p)-symbol code word containing k data symbols and r−p redundancy symbols where (r−p)/2 corresponds to the selected level of error protection. This code word is part of an (n−p,k) punctured code, which is less powerful than the (n,k) code.

During decoding the system treats the p deleted symbols as erasures and corrects the p erasures and up to (r−p)/2 errors in the code word. The system first fills-in the p deleted symbols with pre-assigned symbols, for example, all zero symbols, and establishes pointers to these p symbols, as well as e pointers to detected erasure locations. The system then manipulates the r−p redundancy symbols and the p pre-assigned symbols to produce error syndromes. Using the error syndromes and the p+e pointers, the system determines the error locations and error values for the detected errors and the error values for the e detected erasures, as well as the error values for the p pre-assigned symbols.

In a preferred embodiment, the system deletes the last p of the redundancy symbols. During decoding the system takes advantage of the cyclic property of the Reed-Solomon code and decodes the (n−p)-symbol code word as if the p deleted redundancy symbols are taking the place of pleading code word symbols which are deleted in shortening the code word. The system thus saves time by avoiding filling-in the p deleted redundancy symbols with the pre-assigned symbols during decoding. The system then modifies the error syndromes generated for this (n−p)-symbol code word so that the error locations and error values calculated using these syndromes correspond with the code word symbols, which are essentially shifted p symbol-locations, as discussed in detail below.

The same decoding approach can be taken by a system which uses an (n,k) code which is a shortened code associated with an (N,K) code, where N=n−i. The system decodes the (n−p)-symbol code word and generates error syndromes, without filling-in the p deleted symbols. It then modifies the error syndromes to correspond with the locations of these n−p symbols in the N symbol code word, which are cyclically shifted p symbol locations. This system is discussed in detail below.

BRIEF DESCRIPTION OF THE DRAWINGS

The above and further advantages of the invention may be better understood by referring to the following description in conjunction with the accompanying drawings, in which:

FIG. 1 depicts, in block diagram form, a data processing system;

FIG. 2 is a block diagram of an encoding system of FIG. 1;

DETAILED DESCRIPTION

Figure 3:
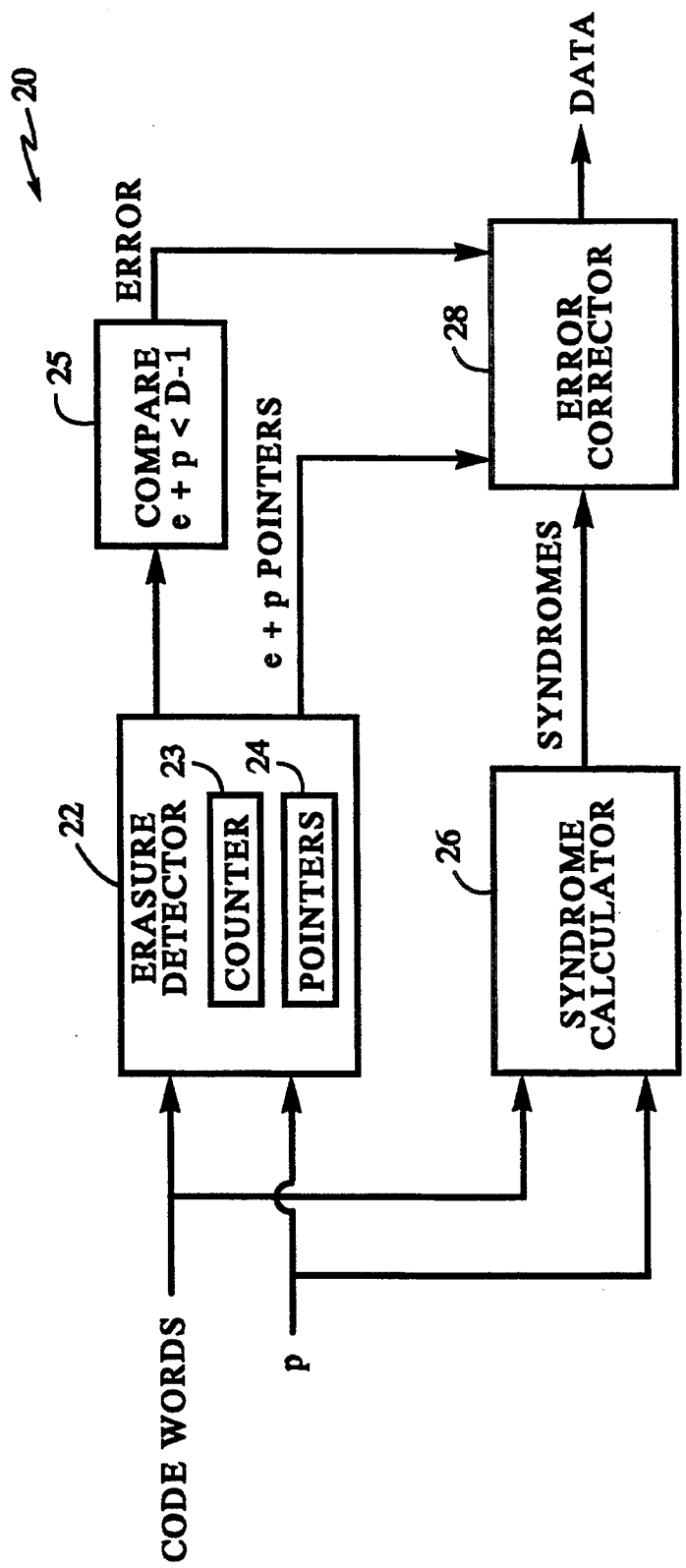
FIG. 3 a block diagram of an error correction system.

FIG. 1 depicts a data processing system 2 which encodes data for storage on optical storage devices 6, magnetic storage devices 7 or for further transmission to a network node 8. A system controller 4 provides to an encoding system 10 data and control information. The encoding/decoding system 10 encodes the data in accordance with an error correction code (ECC) and generates redundancy symbols. It then selects a number of the generated redundancy symbols and appends them to the data to produce error correction code words, as discussed in more detail with reference to FIG. 2 below. The number of redundancy symbols selected may vary depending on the destination of the data, for example, the device on which the data are to be stored. The encoding system 10, under the control of the system controller, sends the code words for storage to a designated optical storage device 6 or magnetic storage device 7, or for further transmission to a network node 8.

FIG. 2 depicts the encoding portion of the encoding/decoding system 10 in more detail. The encoding system 10 includes an encoder 12 for encoding data for error protection and a code word transmitter 16 for transmitting data code words to a designated storage or network device 6–8 (FIG. 1). The encoder 12 encodes, in a conventional manner, k data symbols in accordance with an (n,k) Reed-Solomon code with generator polynomial g(x) and produces n−k, or r, redundancy symbols. The encoder 12 temporarily retains the redundancy symbols in a buffer 14.

The system controller 4 (FIG. 1) selects a level of error correction based on, for example, the medium on which the data is to be stored. The controller 4 sends to the encoder 12 a value p, $0 \leq p \leq r-2$, associated with the selected level. The encoder then deletes p of the r redundancy symbols and sends the remaining r−p symbols to code word transmitter 16. The transmitter 16 appends the r−p redundancy symbols to the data symbols and transmits an (n−p)-symbol code word to a designated storage device 6 or 7 (FIG. 1).

If, for example, the data processing system is storing the data on a magnetic disk which has a relatively high error rate, it requires the full, (n−k)/2, error correction capabilities of the code. The controller thus sends to the encoder 12 a value p=0. The encoder then sends to the code word transmitter 16, in parallel or in a symbol-serial manner, all r of the redundancy symbols. The transmitter 16 appends the r redundancy symbols to the k data symbols to form an n-symbol code word:

$$c_{n-1}, c_{n-2}, c_{n-3}, c_{n-4}, \ldots c_{n-k}, c_{r-1}, \ldots, c_3, c_2, c_1, c_0$$
| ........data symbols........ | ....redundancy...... |

If the system is storing the data on a disk which has a lower error rate, and it thus does not require the full error correction capabilities of the code, the system controller 4 sends to the encoder 12 a value p, where $0 < p \leq r-2$. The encoder 12 then arbitrarily deletes p symbols from the r redundancy symbols in buffer 14 and sends to the code word transmitter the remaining r−p redundancy symbols. The transmitter 16 appends the r−p redundancy symbols to the k data symbols and produces an (n−p)-symbol code word:

$$c_{n-1}, c_{n-2}, c_{n-3}, c_{n-4}, \ldots c_{n-k}, c_{r-p-1}, c_{r-p-2}, \ldots, c_0$$
| ........data symbols........ | ....redundancy...... | where $c_{r-p-1}, \ldots c_0$ are the redundancy symbols forwarded by the encoder 12. The transmitter 16 then sends the code word to the designated storage device.

Figure 4:
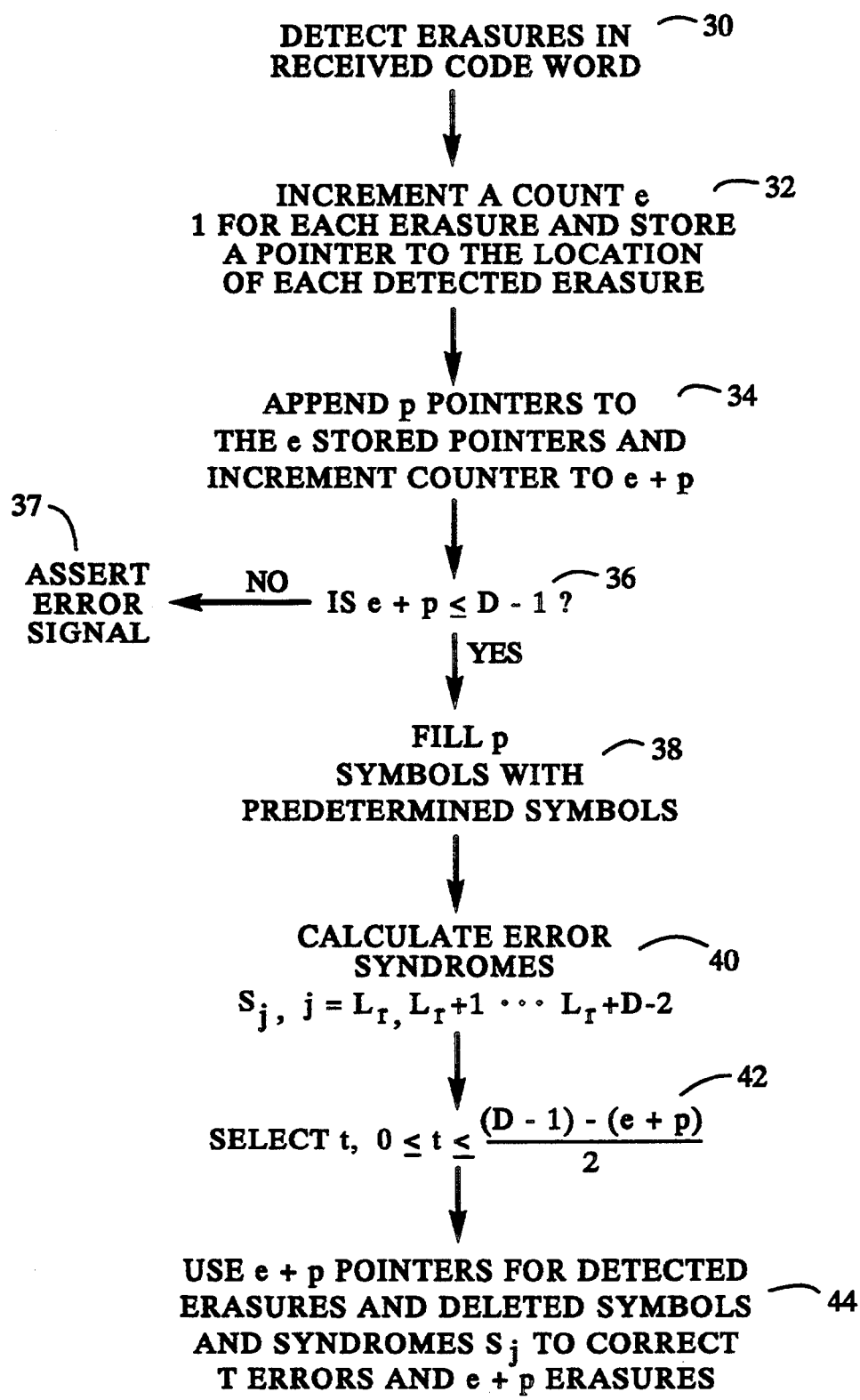
FIG. 4 is a flow chart of the operations of the error correction system depicted in FIG. 3.

FIG. 3 depicts an error correction system 20, which is included in the encoding/decoding system 10 of FIG. 1 and FIG. 4 is a flow chart describing the operations of the system 20, which detects and corrects errors in code words retrieved from, for example, a magnetic storage device 7. An erasure detector 22 detects erasures in a retrieved (n−p)-symbol code word and retains in a buffer 24, for each detected erasure, a pointer to the associated code word symbol location (step 30). The detector 22 also increments an erasure counter 23 for each detected erasure (step 32). Thus if the circuit detects e erasures, it increments the erasure counter 23 e-times and formulates and stores e pointers. The erasure detection circuitry then appends p pointers, which correspond to the locations of the p deleted symbols, to these e pointers and increments the erasure counter 23 to a count of e+p (step 34).

Next, a compare circuit 25 compares the number of erasures, i.e., e+p, with the minimum distance, $D = r+1$, associated with the (n,k) code to determine if the code; can correct that number of erasures (step 36). If the number of erasures is at least one less than the code distance, that is, if $e+p \leq D-1$, the code can potentially correct the erasures. Otherwise, the code can not correct the erasures and the compare circuit 25 sends an error signal to an error corrector 28. In response to the error signal, the error corrector 28 labels the code word data symbols as erroneous and transmits them and the label to the requesting circuitry (not shown) (step 37).

If $e+p \leq D-1$, the compare circuit 25 enables a syndrome calculator 26, which fills-in the p deleted redundancy symbols with predetermined symbols, for example, all-zero symbols, to produce an n-symbol code word (step 38). The syndrome calculator 26 then manipulates the n-symbol code word symbols using conventional techniques to produce code word error syndromes $S_j$ (step 40):

$$S_j = \sum_{k=0}^{k=n-1} c_k' \alpha^{jk}$$

for $j = Lr, Lr+1, Lr+2, \ldots, Lr+D-2$ where $c_k'$ is the $k^{th}$ symbol of the received, or retrieved, n-symbol code word, Lr is the lowest root of the generator polynomial g(x) and multiplication and summation operations are Galois Field operations. In conventional error correcting circuits, the generated syndromes are checked to determine if they are all zeros, which indicates that there are no errors in the code word. The error correction system 20 may omit this step if the code word is associated with p>0 erasures.

The number of errors which can be corrected in a code word which has p deleted symbols, which are treated as p erasures, is (r−p)/2. If an additional "e" erasures are detected during decoding, a maximum of [(r−p)−e]/2 errors can be corrected along with the e+p erasures. The syndrome calculator next selects a maximum number of errors, t, to be corrected, where $0 \leq t \leq [(D-1)-(e+p)]/2$ (Step 42). The calculator selects t such that it takes advantage of the error correcting power of the code while, at the same time, it keeps to an acceptable value the probability that the error correction circuit will mistakenly "correct" non-erroneous code word symbols. By "correcting" these non-erroneous symbols, the error correction circuit may transform the received code word into another code word of the (n,k) code, which introduces into the data an undetectable decoding error. The smaller the selected t, the less likely it is that the error correction circuit will make such a mistake.

The error correction circuit 28 receives the syndromes $S_j$ from the syndrome calculator 26 and the e+p erasure pointers from the erasure detection circuit 23 and corrects errors in the code word by performing, in a conventional manner, a t-error and (e+p)-erasure correction procedure (step 44). If the error correction circuit 28 can locate and correct all of the t+e detected errors and erasures, the error correction circuit sends the corrected code word data symbols to the device (not shown) which requested them. If the error correction circuit can not correct all of the errors, it labels the data symbols as erroneous and sends them along with the label to the requesting device.

The decoding system can correct up to $(r-p-e)/2$ detected errors and e erasures in any code word formulated using $r-p$ of the redundancy symbols generated by encoding the data in accordance with the original (n,k) ECC. The decoding system need not include separate decoders for code words containing various numbers of redundancy symbols. A single decoder can thus be used to decode code words associated with powerful error protection (r redundancy symbols) and code words associated with less powerful error protection (fewer than r redundancy symbols).

In a preferred embodiment, the symbols that are deleted are the last p of the r redundancy symbols. The system thus forms a code word by appending the first $r-p$ redundancy symbols to the k data symbols. The system could decode the code word by appending p predetermined symbols to the end of a received code word to fill in the deleted symbols and correcting t errors and $e+p$ erasures using conventional techniques, as discussed above. However, a preferred decoding technique takes advantage of the cyclic properties of Reed-Solomon codes and decodes the code word as if the p deleted redundancy symbols are taking the place of the p leading symbols which are ignored when shortening the code word. The code word conceptually corresponds to:

```
               c_{n-1},c_{n-2},...,c_{n-k}  c_{n-k-1},...,c_{p+2},c_{p+1},c_p
| ..p deleted.. | .......data........ | ...r-p redundancy..... |
   symbols          symbols                   symbols
```

The system generates error syndromes using the (n−p)-symbol code word, and then modifies the syndromes to compensate for the p deleted symbols, as discussed in more detail below with reference to FIG. 5. Accordingly, the system avoids filling-in the p deleted symbols, and it can thus begin to calculate the error syndromes as soon as it receives the last code word symbol, $c_p$.

If the (n,k) ECC used in encoder 12 (FIG. 2) is a shortened version of an (N,K) code, where $K=k+i$, a decoder must, when it modifies the error syndromes to compensate for the p-symbol cyclic shifting, also take into account the previously deleted i leading code word symbols, depicted here as i all-zero symbols. The received code word conceptually corresponds to:

```
             00000...0000   c_{n-1},...,c_{n-k}  c_{n-k-1},...,c_{p+1},c_p
| p deleted.. | ..i deleted.. | .....data....... | r-p redundancy... |
   symbols    leading-zero      symbols              symbols
                symbols
``` where the first non-zero data symbol, which is in location $N-i$ in an N-symbol code word, is shifted to location $(N-i)-p$ when the last p redundancy symbols are cyclically shifted to locations at the beginning of the N-symbol code word.

As the number of deletions increases, it takes longer and longer for the error correction circuit 28 (FIG. 3) to compute syndromes, if the circuit computes them in series, or more and more complex the syndrome calculation circuitry to compute syndromes, if the circuit computes them in parallel. If a maximum value of $t+e$ is specified, a preferred embodiment of the error correcting system modifies the calculated syndromes based on the number of deletions, that is, based on the value p, such that these syndromes correspond to syndromes calculated for a code word of an (n−p,k) punctured code, as discussed in more detail below with reference to FIG. 5. The system then need only compute polynomials of degree $t+e$, instead of degree $t+e+p$, which saves in decoding time.

The system uses the modified syndromes and a t-error and e-erasure decoding procedure to determine $t+e$ error values and t error locations for the (n−p)-symbol code word. Since the system earlier compensated for the p deleted redundancy symbols by modifying the syndromes, the system can now ignore these symbols. The system must, however, modify the $t+e$ calculated error values, to conform them to the cyclically shifted code word, as discussed below with reference to FIGS. 6 through 9.

Figure 5:
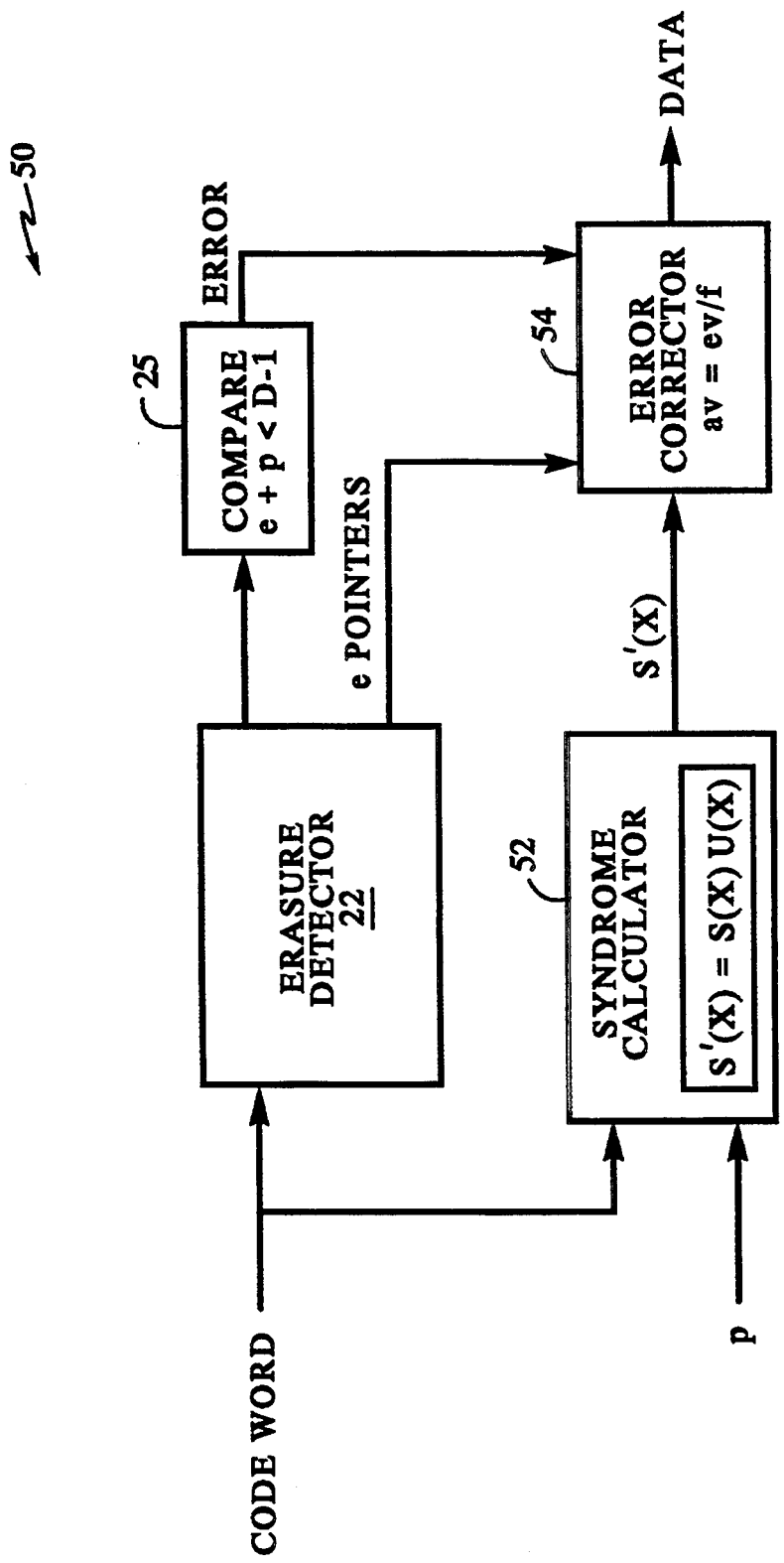
FIG. 5 is a block diagram of a preferred embodiment of an error correction system.

FIG. 5 depicts a system 50 for correcting errors in a code word using a t-error and e-erasure decoding procedure. After the e erasures are detected by erasure detector 22 and the count $e+p$ is compared with the code distance D by compare circuit 25, a syndrome calculator 52 determines in a conventional manner syndromes $S_j$, $j=Lr, Lr+1, \ldots Lr+D-2$. The syndromes can be represented by a polynomial $S(x)$, $$S(x) = S_{Lr} + S_{Lr+1}x + S_{Lr+2}x^2 + \ldots + S_{Lr+D-2}x^{D-2}$$

The code word locations corresponding to the p deleted symbols can be represented by a polynomial $U(x) = 1 + U_1 x + U_2 x^2 \ldots + U_P x^P$, which can be rewritten as:

$$U(x) = (\alpha^{n-1}x+1)(\alpha^{n-2}x+1) \ldots (\alpha^{n-P}x+1),$$

where the p deleted symbols are shifted to the locations set forth in table 1:

TABLE 1

| position of unshifted redundancy symbol | position of shifted symbol |
|---|---|
| 0 | n − p |
| 1 | n − p + 1 |
| 2 | n − p + 2 |
| ... | — |
| h | n − p + h |
| ... | — |
| p − 1 | n − p + (p − 1) = n − 1 |

The modified syndromes, $S'(x)$, are then:

$$S'(x) = S(x)U(x).$$

If the (n,k) code is a shortened version of an (N,K) code, U(X) becomes $$U(x) = (\alpha^{N-1}x+1)(\alpha^{N-2}x+1) \ldots (\alpha^{N-P}x+1).$$

U(X) may be pre-calculated for various values of p and stored in the syndrome calculator or iteratively determined for each code word, as discussed below with reference to FIGS. 6 and 8.

The lowest p terms of the modified syndrome equation can be ignored, since these terms relate to the p deleted redundancy symbols and the remaining terms are what is required to solve for the error values and error locations. The error corrector circuit 54 then uses the remaining modified syndromes and the pointers to the e detected erasure locations to determine up to t error locations "ei" and $t+e$ error values "ev."

Since p may be selected as any value between 0 and $r-2$, $U(x)$ is not a constant. FIGS. 6 and 8 are flow charts which depict, respectively, the operations of the syndrome calculator 52 of FIG. 5 in modifying the syndromes $S_j$ iteratively and in modifying the syndromes in parallel.

Figure 6:
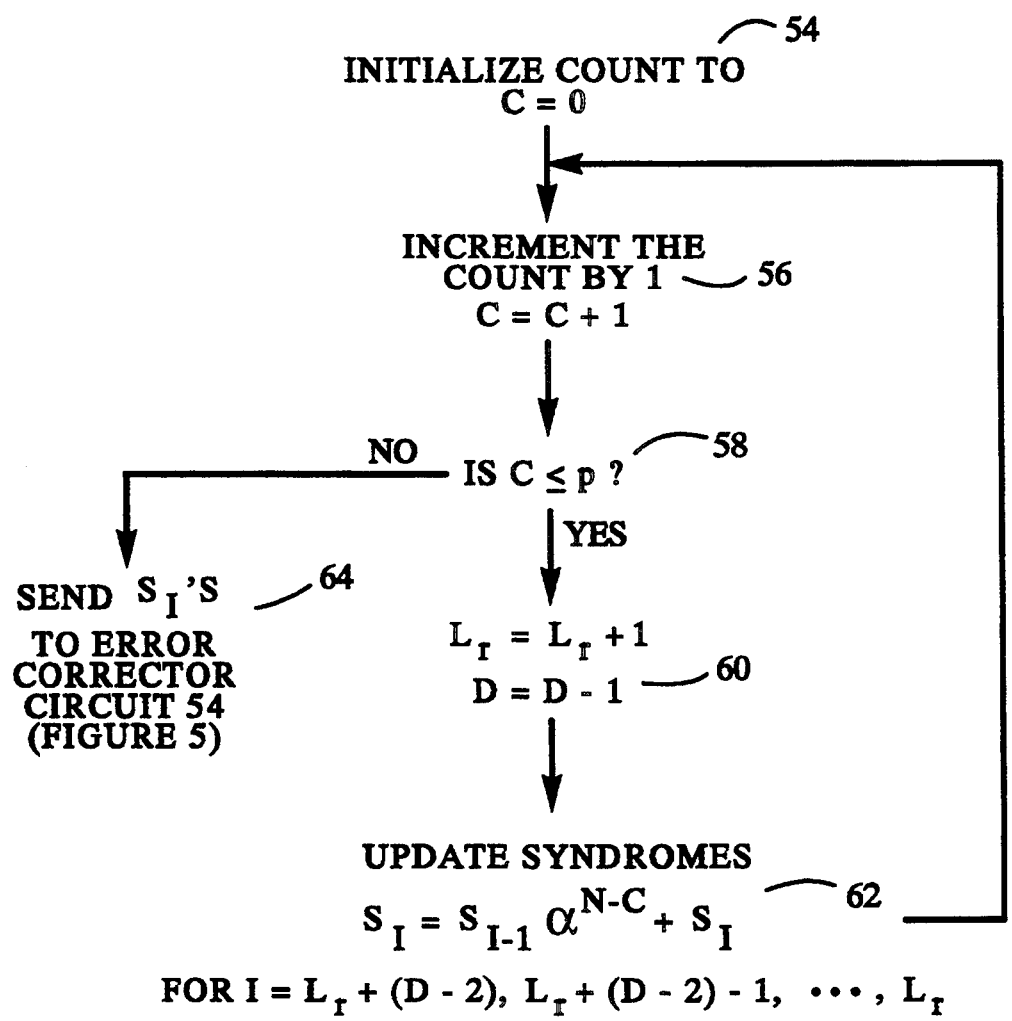
FIG. 6 is a flow chart of the operations of one embodiment of a syndrome calculator depicted in FIG. 5 that iteratively modifies error syndromes.

Referring now to FIG. 6, the calculator 52 initializes an internal count to c=0 (step 54). It then increments the count by 1 and compares the count to p (steps 56-58). If the count c is less than p, the calculator increments Lr by 1 and decrements D by 1 (step 60). It then updates (step 62) the syndromes to:

$$S_I = S_{I-1}\alpha^{n-c} + S_I$$

$$I = Lr+(D-2), Lr+(D-2)-1, \ldots, Lr$$

If the (n,k) code is a shortened version of an (N,K) code, the value N is used in place of n.

The calculator again increments the count c by 1 and compares it with p. If c≤p, the calculator increments Lr by 1, decrements D by 1 and updates the syndromes (steps 60-62). The calculator repeats these operations until the count c exceeds p, which indicates that the modified syndromes correspond with a code word which has been punctured by the deletion of p symbols. The calculator then sends the modified syndromes to the error corrector circuit 54 (step 64).

The error corrector circuit 54 uses the modified syndromes to determine, in a conventional manner using a t-error and e-erasure error correction procedure, up to t error locations and t+e error values. The error corrector circuit must then manipulate the error values to compensate for the p-location cyclic shifting of the code word symbols. Accordingly, the error corrector circuit produces for each error value, ev, determined using the modified syndromes an actual error value, "av:"

$$av = ev/f$$

where $f = U(\alpha^{-ei})$, ei is the error or erasure location associated with the error value and, as discussed above, $U(x) = 1 + U_1 x + U_2 x^2 + \ldots + U_P x^P$. Thus $f = (\alpha^{n-1-ei}+1)(\alpha^{n-2-ei}+1) \ldots (\alpha^{n-P-ei}+1)$, with the value N being used for n if the (n,k) code is a shortened version of the (N,K) code.

Figure 7:
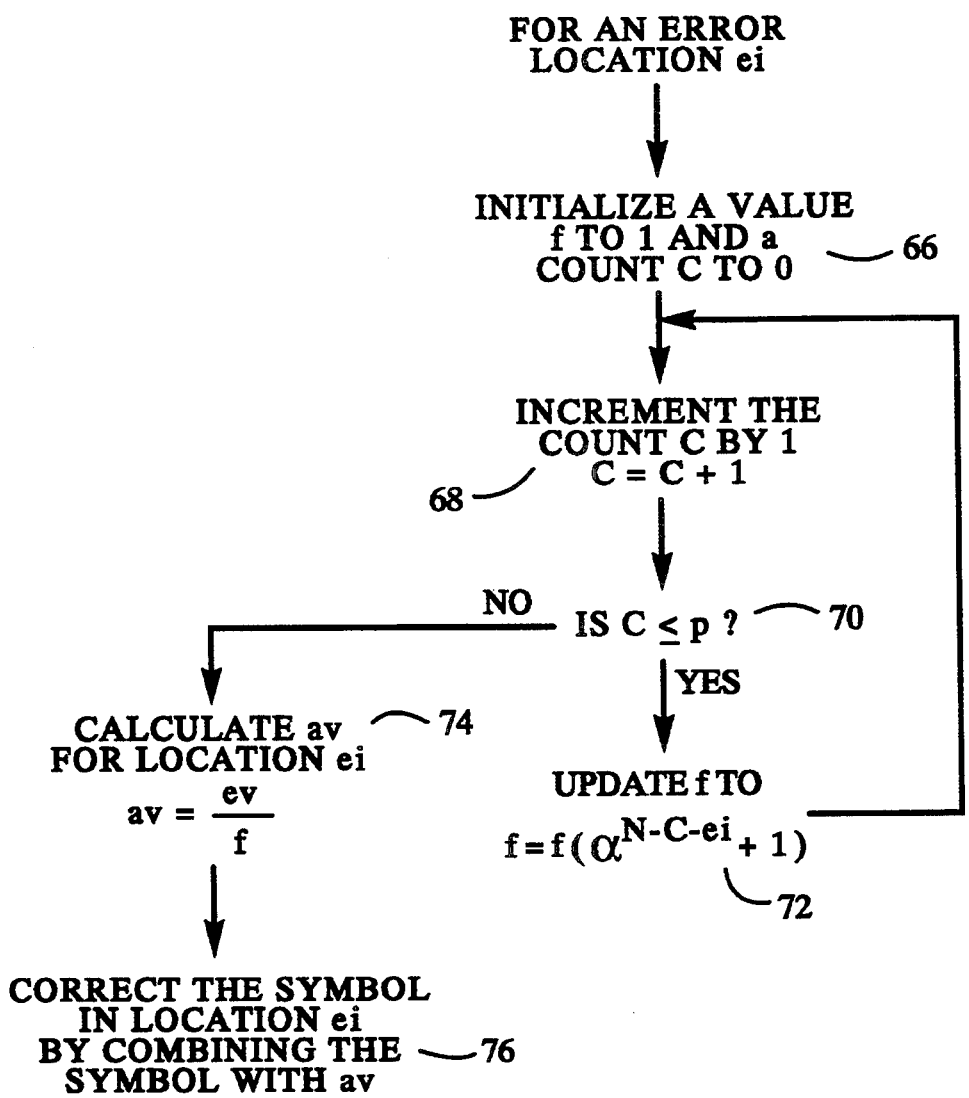
FIG. 7 is a flow chart of the operations of one embodiment of an error corrector depicted in FIG. 5 that iteratively modifies error and erasure values.
Figure 9:
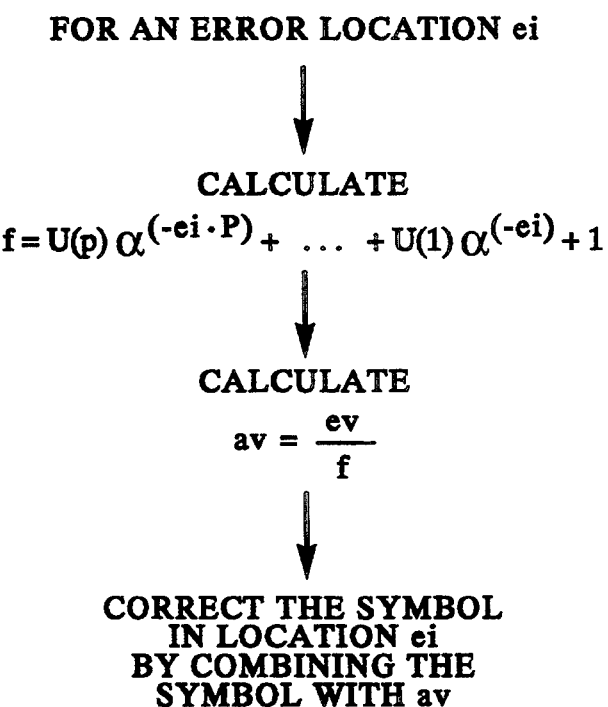
FIG. 9 is a flow chart of the operations of another embodiment of the error corrector depicted in FIG. 5 that modifies error and erasure values in parallel.

The polynomial f may be determined iteratively or in parallel. FIG. 7 is a flow chart of the operations of the error correction circuit 54 in determining the polynomial iteratively. FIG. 9, discussed below, is a flow chart of the operations of the error correction circuit 54 in determining the polynomial in parallel.

To determine f iteratively, the error correction circuit 54 initializes f to 1 and a count, c, to 0 (step 66). The correction circuit increments the count by 1 (step 68), compares the count to p (Step 70) and if the count is less than or equal to p, the correction circuit multiplies f by $(\alpha^{n-c-ei}+1)$ and produces an updated f (step 72). The error correction circuit again increments the count c by 1, compares it with p and if the count is less than or equal to p, it again multiplies f by $(\alpha^{n-c-ei}+1)$, and so forth. When the count exceeds p, the correction circuit divides ev by f to produce the associated actual error value, av, which corresponds to the symbol in location ei (step 74).

The error correction circuit ultimately combines the actual error value, av, with the code word symbol in location ei and corrects the symbol (step 76). The correction circuit may correct each error as soon as the appropriate actual error value is determined, or it may store the actual error values and combine them with the corresponding code word symbols in one operation.

Figure 8:
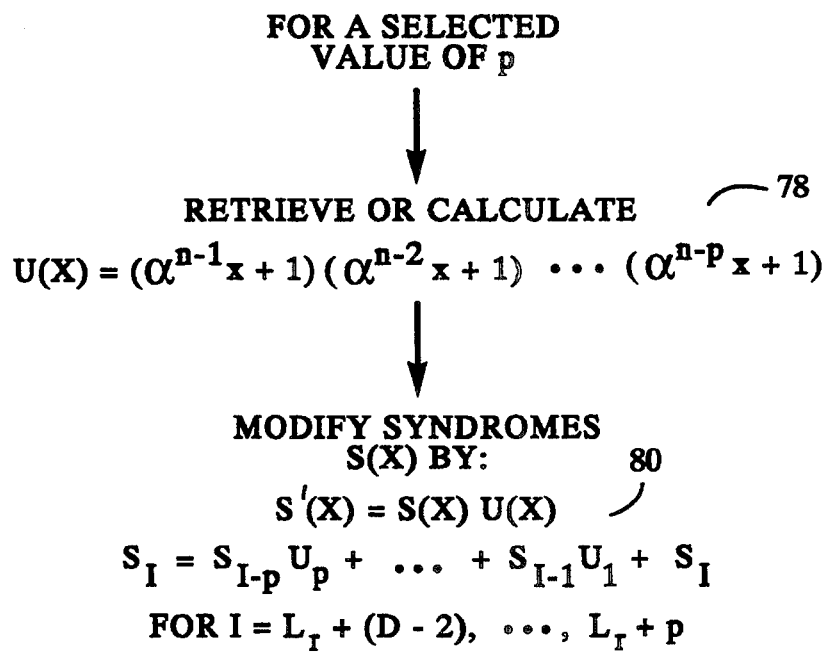
FIG. 8 is a flow chart of the operations of another embodiment of the syndrome calculator depicted in FIG. 5 that modifies error syndromes in parallel.

FIG. 8 depicts the operation of the syndrome calculator 52 (FIG. 5) which modifies the error syndromes $S_j$ in one step by pre-calculating U(x) and updating the syndromes to $$S_I = S_{I-P} U_P + S_{I-P+1} U_{P-1} + \ldots + S_{I-1} U_1 + S_I$$

$$I = Lr+(D-2), \ldots, Lr+p.$$

The syndrome calculator includes either a memory for storing the values for the coefficients of U(x) for all possible values of p, or a circuit which calculates the coefficients of U(X) for a selected value of p (step 78). The calculator then modifies the syndromes by multiplying them by the appropriate coefficients of the pre-calculated U(X) (step 80) to produce: $S_I = S_{I-P} U_P + S_{I-(P-1)} U_{P-1} + \ldots + S_{I-1} U_1 + S_I$. The system then uses these modified syndromes to determine error locations, ei, and error values, ev, in a conventional manner.

Once the error values, ev, are determined, the system modifies them to correspond with the shifted code word. It thus either iteratively modifies the error values, as discussed with reference to FIG. 7 above, or it does so in parallel, as is depicted in FIG. 9 When the system modifies the error values in parallel, it uses the precalculated polynomial U(x) for the selected p and calculates for each detected error and erasure location, ei:

$$F = U_P \alpha^{-eiP} + \ldots + U_2 \alpha^{-ei2} + U_1 \alpha^{-ei} + 1$$

and determines the corresponding actual error value, av:

$$av = ev/f$$

The error correction circuit 54 then corrects the error at location ei by combining the actual error value with the code word symbol, as discussed above with reference to FIG. 7.

In summary, the error correction system encodes and decodes data in accordance with a selectable number of redundancy symbols, which affords data selectable levels of error protection. The system uses a single encoder to produce code words containing k data symbols, and a selected number of redundancy symbols between 2 and r symbols. Similarly, the system uses a single decoder to decode the variously sized code words and correct in each code word up to an appropriate number of errors, where the number of errors for each code word is related to the selected number of redundancy symbols.

In the preferred embodiment, the system deletes the last p of the redundancy symbols, where r−p is the selected number of redundancy symbols for an (r−p)/2 desired error correction capability, and produces (n−p)-symbol code words of an (n−p,k) punctured code. It later decodes the code words as if the p deleted symbols are the symbols deleted in shortening the code word and produces error syndromes without filling-in the p deleted symbols. It then modifies the error syndromes appropriately to compensate for the p deleted symbols. Using these error syndromes, the system corrects up to t errors and e erasures using a t-error and e-erasure correction procedure to determine error locations and error and erasure values. It then modifies the error values to compensate for the p-symbol cyclic shifting of code word symbols attributable to the treatment of the deleted redundancy symbols as the p leading symbols which are deleted in the shortening of the code word.

The foregoing description has been limited to specific embodiments of the invention. It will be apparent, however, that variations and modifications may be made to the invention, with the attainment of some or all of its advantages. Therefore, it is the object of the appended claims to cover all such variations and modifications as come within the true spirit and scope of the invention.

What is claimed is:

1. An error correction system comprising:
   an encoder for encoding k data symbols in accordance with a distance D (n,k) Reed-Solomon error correction code and producing r=n−k redundancy symbols;
   selection means for selecting an error correction level, the selection means setting an associated value p, $0 \leq p \leq r-2$;
   means for deleting p of the r redundancy symbols;
   code word means for forming an (n−p)-symbol code word, the code word means appending r−p redundancy symbols to the k data symbols;
   an erasure detector maintaining an erasure count and erasure pointers, the erasure count being incremented and a corresponding erasure pointer being stored for each of said p deleted redundancy symbols, each stored erasure pointer pointing to the symbol position occupied by the corresponding deleted redundancy symbol;
   means for filling with predetermined symbols the code word locations corresponding to the p deleted redundancy symbols and producing an n-symbol code word having k retrieved data symbols, r−p retrieved redundancy symbols, and p filled redundancy symbols;
   a syndrome calculator for calculating error syndromes for the n-symbol code word;
   compare means for comparing said erasure count and D, the compare means asserting an error signal if said erasure count is greater than D−1; and
   error correction means for manipulating the error syndromes and the erasure pointers to determine error locations and error and erasure values, and for correcting errors and erasures in the code word by combining the determined error and erasure values with the code word symbols in the corresponding locations if the compare means has not asserted the error signal, the error correction means responding to an asserted error signal by labeling the code word data as erroneous and refraining from so manipulating and correcting.

2. The error correction system of claim 1, wherein said erasure detector includes means for detecting e erasures in a code word, $e \leq 0$, and wherein the erasure count is incremented and a corresponding erasure pointer is stored for each of said e detected erasures.

3. The error correction system of claim 1, wherein the p deleted redundancy symbols are the p least significant redundancy symbols.

4. An error correction system comprising:
   an encoder for encoding k data symbols in accordance with a distance D (n,k) Reed-Solomon error correction code and producing r=n−k redundancy symbols;
   selection means for selecting an error correction level, the selection means setting an associated value p, $0 \leq p \leq r-2$;
   means for deleting the p least significant ones of the r redundancy Symbols;
   code word means for forming an (n−p)-symbol code word, the code word means appending r−p redundancy symbols to the k data symbols;
   an erasure detector maintaining an erasure count that is incremented for each of said p deleted redundancy symbols;
   a syndrome calculator for calculating error syndromes, S(x) for an n-symbol code word consisting of p leading zeroes, k retrieved data symbols and r−p retrieved redundancy symbols, the syndrome calculator containing means for modifying the syndromes by multiplying them by a polynomial U(x) associated with the p deleted symbols;
   compare means for comparing said erasure count and D, the compare means asserting an error signal if said erasure count is greater than D−1; and error correction means for correcting errors in the code word, the error correction means including
   i. means for manipulating the modified error syndromes to determine error locations and corresponding error values, ev,
   ii. error value modifying means for modifying the error values, the error value modifying means determining an actual error value, av, associated with an error value, ev, by determining $$av = ev/f$$

where f is $U(\alpha^{-ei})$ and ei is the location of a detected error and
   iii. correction means for correcting the errors by combining the actual error values, av, with their corresponding code word symbols.

5. The error correction system of claim 4, wherein the syndrome modifying means includes:
   i. a counter for counting iterations, the counter being initialized to c=0;
   ii. means for comparing the count c to p;
   iii. means for incrementing an index Lr to Lr+1, where Lr is initialized to the value of the lowest root of the (n,k) code generator polynomial, if $c \leq p$;
   iv. means for decrementing an index D to D−1, where D is initialized to the distance of the (n,k) code; and
   v. means for updating the syndromes to $$S_I = S_{I-1} \alpha^{n-c} + S_I \text{ for}$$
   $$I = Lr+(D-2), Lr+(D-2)-1, \ldots, Lr;$$

and wherein the syndrome calculator increments the counter c for each iteration and updates the syndromes for each new value of Lr and D, until c exceeds p.

6. The error correction system of claim 4, wherein the error value modifying means includes:
   i. an iteration counter initialized to c=0;
   ii. means for comparing c to p; and
   iii. an iterative f calculator initialized to f=1, the f calculator updating f for each iteration in which $c \leq p$ to $f = f * (\alpha^{n-c-ei} + 1)$, where "*" represents Galois Field multiplication;
   and wherein the error value modifying means increments the iteration counter by 1 for each iteration.

7. The error correction system of claim 4, wherein the syndrome modifying means includes:
  i. means for determining U(x) for the value of p selected by the selecting means; and
  ii. means for updating the syndromes to $$S_I = S_{I-p}U_p + S_{I-p+1}U_{p-1} + \ldots + S_{I-1}U_1 + S_I$$
for $I = Lr+(D-2), \ldots, Lr+p$.

8. The error correction system of claim 7, wherein the U(x) determining means comprises means for calculating U(x) for the selected value of p.

9. The error correction system of claim 7, wherein the U(x) determining means comprises:
  means for storing U(x)'s each pre-calculated from a corresponding one of all possible values of p; and
  means for retrieving the stored pre-calculated U(x) corresponding to the selected value of p.

10. The error correction system of claim 4, wherein the error value modifying means includes:
  i. means for determining U(x) for the value of p selected by the selecting means; and
  ii. a parallel f calculator for calculating f as:

$$f = U_p \alpha^{(-ei)(p)} + U_{p-1} \alpha^{(-ei)(p-1)} + \ldots + U_1 \alpha^{(-ei)(1)} + 1.$$

11. The error correction system of claim 10, wherein the U(x) determining means comprises means for calculating U(x) for the selected value of p.

12. The error correction system of claim 10, wherein the U(x) determining means comprises:
  means for storing U(x)'s each pre-calculated from a corresponding one of all possible values of p; and
  means for retrieving the stored pre-calculated u(x) corresponding to the selected value of p.

13. The error correction system of claim 4, wherein said erasure detector includes means for detecting e erasures in a code word, $e \leq 0$, wherein the erasure count is incremented and a corresponding erasure pointer is stored for each of said e detected erasures, and wherein said error correction means manipulates both the error syndromes and the erasure pointers to determine error locations and error and erasure values, and also corrects errors and erasures in the code word by combining the determined error and erasure values with the code word symbols in the corresponding locations if the compare means has not asserted the error signal, the error correction means responding to an asserted error signal by labeling the code word data as erroneous and refraining from so manipulating and correcting.

14. An error correction system, comprising:
  an encoder for encoding k data symbols in accordance with a distance D (n,k) Reed-Solomon error correction code and producing $r = n-k$ redundancy symbols;
  selection means for selecting an error correction level, the selection means setting an associated value p, $0 \leq p \leq r-2$;
  means for deleting the p least significant ones of the r redundancy symbols;
  code word means for forming an (n−p)-symbol code word, the code word means appending r−p redundancy symbols to the k data symbols;
  an erasure detector maintaining an erasure count and erasure pointers, the erasure count being incremented and an erasure pointer being stored for each of said p deleted redundancy symbols, each stored erasure pointer pointing to the symbol position that would be occupied by the corresponding deleted redundancy symbol after cyclically right shifting the n-symbol codeword p times;
  a syndrome calculator for calculating error syndromes for an n-symbol code word consisting of p leading zeroes, k retrieved data symbols and r−p retrieved redundancy symbols;
  compare means for comparing said erasure count and D, the compare means asserting an error signal if said erasure count is greater than D−1; and
  error correction means for manipulating the error syndromes and the erasure pointers to determine error locations and error and erasure values, and for correcting errors and erasures in the code word by combining the determined error and erasure values with the code word symbols in the corresponding locations if the compare means has not asserted the error signal, the error correction means responding to an asserted error signal by labeling the code word data as erroneous and refraining from so manipulating and correcting.

15. The error correction system of claim 14, wherein said erasure detector includes means for detecting e erasures in a code word, $e \leq 0$, and wherein the erasure count is incremented and a corresponding erasure pointer is stored for each of said e detected erasures.

* * * * *